(12) United States Patent
Chu et al.

(10) Patent No.: US 10,160,638 B2
(45) Date of Patent: Dec. 25, 2018

(54) METHOD AND APPARATUS FOR A SEMICONDUCTOR STRUCTURE

(71) Applicant: Taiwan Semiconductor Manufacturing Company, Ltd., Hsin-Chu (TW)

(72) Inventors: Li-Cheng Chu, Taipei (TW); Ping-Yin Liu, Yonghe (TW); Xin-Hua Huang, Xihu Township (TW); Yuan-Chih Hsieh, Hsin-Chu (TW); Lan-Lin Chao, Sindian (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/734,146

(22) Filed: Jan. 4, 2013

(65) Prior Publication Data
US 2014/0191341 A1    Jul. 10, 2014

(51) Int. Cl.
*H01L 29/82* (2006.01)
*B81C 1/00* (2006.01)
*B81B 7/00* (2006.01)

(52) U.S. Cl.
CPC ........ *B81C 1/00238* (2013.01); *B81B 7/0038* (2013.01); *B81B 2207/017* (2013.01); *B81C 2203/0792* (2013.01)

(58) Field of Classification Search
CPC ......... H01L 21/3221; H01L 2221/6835; H01L 2221/68377; H01L 2924/16152; H01L 29/84; B81C 1/00238; B81C 1/00269; B81C 2203/0118; B81C 3/001; G01J 5/045; B81B 7/0038
See application file for complete search history.

(56) References Cited

U.S. PATENT DOCUMENTS

| | | |
|---|---|---|
| 7,442,570 B2 | 10/2008 | Nasiri et al. |
| 7,534,658 B2 | 5/2009 | Amiotti |
| 7,566,957 B2 | 7/2009 | Amiotti |
| 7,576,435 B2 | 8/2009 | Chao |
| 7,808,091 B2 | 10/2010 | Amiotti |
| 7,833,880 B2 | 11/2010 | Rizzi |
| 7,871,660 B2 | 1/2011 | Moraja et al. |
| 8,058,143 B2 | 11/2011 | Montez et al. |

(Continued)

FOREIGN PATENT DOCUMENTS

| | | |
|---|---|---|
| CN | 1599806 A | 3/2005 |
| CN | 101807558 A | 8/2010 |

(Continued)

*Primary Examiner* — Samuel Gebremariam
(74) *Attorney, Agent, or Firm* — Slater Matsil, LLP

(57) ABSTRACT

A semiconductor structure may include a first device having first surface with a first bonding layer formed thereon and a second device having a first surface with a second bonding layer formed thereon. The first bonding layer may provide an electrically conductive path to at least one electrical device in the first device. The second bonding layer may provide an electrically conductive path to at least one electrical device in the second device. One of the first or the second devices may include MEMS electrical devices. The first and/or the second bonding layers may be formed of a getter material, which may provide absorption for outgassing.

20 Claims, 4 Drawing Sheets

(56) References Cited

U.S. PATENT DOCUMENTS

| | | | |
|---|---|---|---|
| 8,105,860 B2 | 1/2012 | Amiotti | |
| 2003/0089394 A1* | 5/2003 | Chang-Chien | B81B 7/0038 137/14 |
| 2003/0207487 A1* | 11/2003 | Kubena | B81C 1/0015 438/52 |
| 2008/0073766 A1* | 3/2008 | Amiotti | B81C 1/00285 257/682 |
| 2008/0283991 A1* | 11/2008 | Reinert | B81B 7/007 257/685 |
| 2011/0079889 A1* | 4/2011 | Baillin | B81B 7/0038 257/682 |

FOREIGN PATENT DOCUMENTS

| | | |
|---|---|---|
| TW | 200843061 | 11/2008 |
| TW | 201034091 | 9/2010 |

\* cited by examiner

400

METHOD AND APPARATUS FOR A SEMICONDUCTOR STRUCTURE

BACKGROUND

In the semiconductor process, integrated circuits are fabricated on a semiconductor wafer. Semiconductor wafers can be stacked or bonded on top of each other to form what is referred to as a three-dimensional ("3D") IC. Some semiconductor wafers include micro-electro-mechanical systems ("MEMS"), which is the technology of forming micro-structures with dimensions in the micrometer scale (one millionth of a meter). Typically, MEMS devices are built on silicon wafers and realized in thin films of materials.

MEMS applications include inertial sensors applications, such as motion sensors, accelerometers, and gyroscopes. Other MEMS applications include optical applications such as movable mirrors, and RF applications such as RF switches and resonators. MEMS devices introduce their own unique requirements into the integration process, however. Electrically interconnecting MEMS devices is an area of unique challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Before addressing illustrative embodiments of the present disclosure in detail, various embodiments and advantageous features thereof will be discussed generally. For instance, in some embodiments wafer level bonding (also referred to herein as "wafer level packaging") is performed between two wafers or devices. One device may, for example, be a MEMS device and another device may be a capping wafer or a CMOS device. The devices may be bonded together to form a packaged device having hermetic vacuum environment in micro chambers or cavities between the bonded devices. Throughout various applications of the packaged device, vacuum levels within the packaged micro chambers may vary from about 0.1 to 100 mbar, as a result of high thermal budgets for the devices. As pressure may vary within the micro chambers, outgassing may occur within the micro chambers or cavities. The outgassing may affect the vacuum level of the packaged device.

Bonding as described for the various embodiments may provide various features for maintaining a good hermetic (mechanical) seal between the bonded devices, absorption of outgassing, as well as providing an electrically conductive path for connecting bonded devices. Advantages of the embodiments as described herein may include, but not be limited to, a reduced bonding area for bonding devices by providing one or more electrically conductive paths for connecting the devices (and/or electrical devices which may be formed within the devices) and maintaining a good hermetic seal between the bonded devices by absorbing outgassing.

Figure 1:
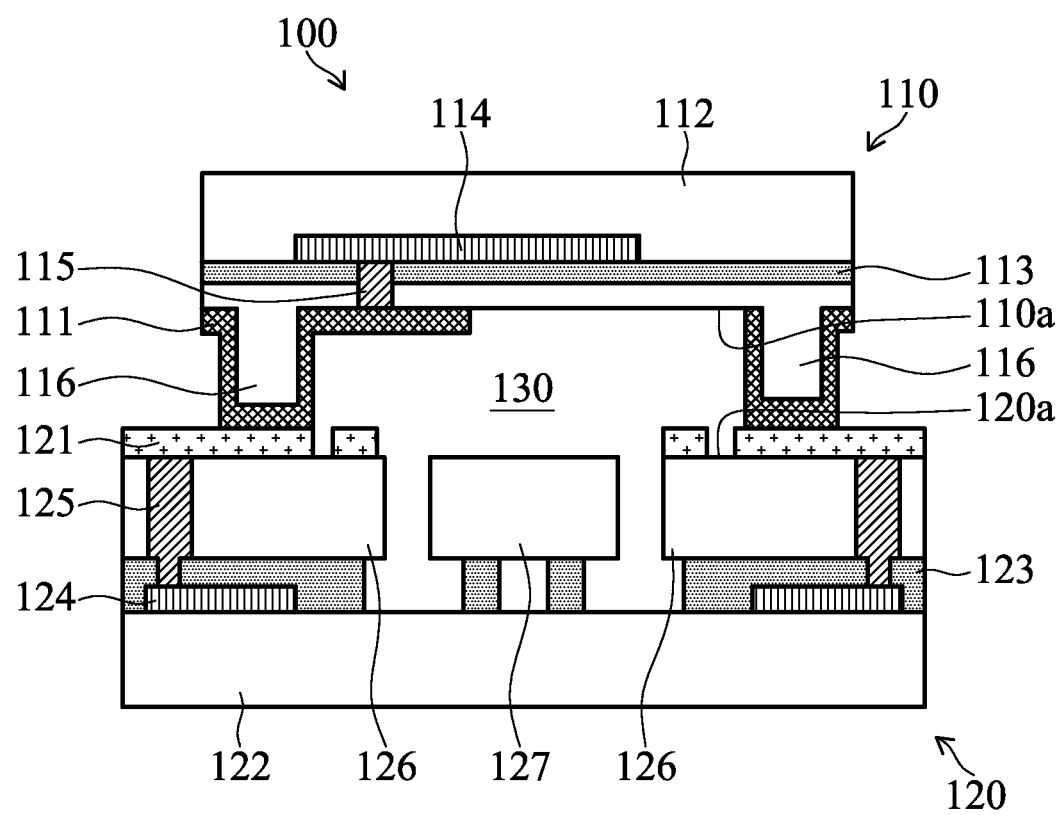
FIG. 1 illustrates a cross sectional view of a semiconductor structure formed according to an embodiment.

FIG. 1 illustrates a cross sectional view of a semiconductor structure 100 according to an embodiment. The semiconductor structure 100 may include a first device 110 having a first bonding layer 111 formed thereon and a second device 120 having a second bonding layer 121 formed thereon. The first device 110 may be bonded together with the second device 120 via the corresponding first and second bonding layers 111, 121 to form the semiconductor structure 100. The first and second bonding layers 111, 121 may be layer of conductive material to provide electrical connection between the first and second devices 110, 120. The semiconductor structure 100 may include one or more cavities or micro chambers 130 formed between the bonded first and second devices 110, 120.

The first device 110 may include a first substrate 112, one or more first dielectric layers 113, one or more first interconnect layers 114, one or more first interconnect vias 115, and one or more first interconnect structures 116. The first bonding layer 111 may be formed on a first surface 110a of the first device 110. The first interconnect vias 115 may provide electrical connection between the various layers of the first device 110 and the first bonding layer 111 as well as provide for electrical connection between electrical devices (not shown), which may be formed within the first device 110, and the first bonding layer 111. The first interconnect structures 116 may provide structural features and/or bonding locations for bonding together the first device 110 and the second device 120.

The second device 120 may include a second substrate 122, one or more second dielectric layers 123, one or more second interconnect layers 124, one or more second interconnect vias 125, and one or more second interconnect structures 126. The second device 120 may also include one or more electrical device portions 127, which may have electrical devices (not shown) formed therein. The second bonding layer 121 may be formed on a second surface 120a of the second device 120. The second interconnect vias 125 may provide electrical connection between the various layers of the second device 120 as well as provide for electrical connection between electrical devices formed within the second device 120 and the second bonding layer 121. The second interconnect structures 126 may provide structural features and/or bonding locations for bonding together the first device 110 and second device 120.

The shape of the first and/or second interconnect structures 116, 126 as illustrated in FIG. 1, are provided for illustrative purposes only and are not intended to implicate specific structural limitations therein. For example, although, the first interconnect structures 116, as illustrated in FIG. 1, are shown as extending from the first device 110, the first interconnect structures 116 may also be formed as non-extending interconnect structures. Connections and layers depicted within the first device and/or second devices 110, 120 are provided for illustrative purposes only and are not intended to implicate specific limitations therein. In various embodiments, the first and/or second devices 110, 120 may be interposers, semiconductor devices, wafers or dies.

The first and second bonding layers 111, 121 may provide a low-resistivity, electrically conductive path between electrical devices (not shown) that may be formed within the first and second devices 110, 120. The first and second bonding layers 111, 121 may also provide for a hermetic seal between the first and second devices 110, 120. The first and/or second bonding layers 111, 121 may provide for the absorption of outgassing. In various embodiments, the first and/or second bonding layers 111, 121 may be formed to a thickness from approximately 200 nm to approximately 5000 nm.

In various embodiments, the first and/or second bonding layers 111, 121 may be made of eutectic alloy material such as AlCu, AlGe or other like material. In various embodiments, the first or second bonding layers 111, 121 may be a low-melting point metal material such as In, Au, Sn, Cu or other like material. In various embodiments, one or both of the first and/or second bonding layers 111, 121 may be formed of a getter material. The getter material may absorb outgassing, which may aid in maintaining a vacuum formed within the micro chambers 130 between the bonded first and second devices 120, 130. The getter material may also provide a low-resistance electrically conductive path between electrical devices (not shown) that may be formed within the first and second devices 110, 120. In various embodiments, the getter material may be made of materials including, for example, zirconium, barium, titanium, aluminum, an aluminum-based alloy or other like material.

To absorb outgassing, a bonding layer, such as, for example, the first or the second bonding layer 111, 121 may include a getter material and may be formed about a portion of the first and/or second devices 110, 120 that may be exposed to the micro chambers 130. For example, the first and/or second bonding layer 111, 121 may be formed about an interior portion of the first and/or second interconnect structures 116, 126 that may be exposed to the micro chambers 130.

In an embodiment, for example, where the first bonding layer 111 may be formed of a getter material, the first bonding layer 111 may be formed to cover the first interconnect structure 116 and extend into an interior portion of the semiconductor structure 100 that may be exposed to the micro chambers 130. In another embodiment, for example, where the second bonding layer 121 may be formed of a getter material, the second bonding layer 121 may be patterned to include one portion on the second interconnect structure 126 that may be in contact with the first bonding layer 111 on the first interconnect structure 116 and another separate portion that may be exposed to the micro chambers 130.

In an embodiment, the first and/or second bonding layers 111, 121 may be patterned or formed to cover a small portion of the respective first and/or second surfaces 110a, 120a, for example, less than approximately 50% of the respective first and/or second surfaces 110a, 120a. In another embodiment, the first and/or second bonding layers 111, 121 may be patterned or formed cover a large portion of the respective first and/or second surfaces 110a, 120a, for example, approximately 90% of the respective first and/or second surfaces 110a, 120a. The coverage area of the first and/or second bonding layers 111, 121 may vary based on the types and/or density of electrical devices (not shown) that may be formed in the first and/or second device 110, 120. In various embodiments, the coverage portion of the first and/or second bonding layers 111, 121 may range from approximately 10% to approximately 90% of the corresponding first and/or second surface 110a, 120a. The first and/or second bonding layers 111, 121 may be formed of CMOS compatible materials, as opposed to non-CMOS compatible materials, which utilize specially processed amorphous substrates to enable formation of bonding layers on a device.

The first and second bonding layers 111, 121 may be formed by CVD, PVD such as sputtering or evaporation, electron gun, ion beam, energy beam, plating, one or more subtractive etch processes, single Damascene techniques, and/or dual-Damascene techniques, the like or other acceptable methods. In various embodiments, the first and/or second bonding layers 111, 121 may include a plurality of getter material layers and/or eutectic material layers.

By providing for a hermetic seal and an electrically conductive pathway between the first and second devices 110, 120, the embodiments discussed herein may provide a reduced bonding and electrical contact area over bonding technologies such as glass frit and fusion bonding, which utilize a ceramic bonding ring in addition to electrical contacts that electrically connect bonded devices. By providing for the absorption of outgassing, the embodiments discussed herein may provide advantages over bonding layers formed only of eutectic materials, which do not provide for outgassing absorption. By providing for CMOS compatible bonding layers, the embodiments discussed herein may provide advantages over thermal compression bonding techniques, which utilize amorphous substrates and often are not compatible with getter materials.

In an embodiment, the first device and/or second devices 110, 120 may be CMOS-type devices, which may have CMOS electrical devices (not shown) formed therein. The CMOS electrical devices may include active and passive devices such as transistors, capacitors, resistors, combinations of these and the like. The active and passive devices may be formed using any suitable methods.

In another embodiment, the first device 110 may be a cap-type device (not shown), which may not include passive devices or active devices formed therein. The cap-type device may provide capping for the second device 120 to hermetically seal the second device 120. In an embodiment, a cap-type (not shown) first device 110 may include interconnect layers that may provide paths for signal connection within the cap-type first device 110. In another embodiment, a cap-type (not shown) first device 110 may include interconnect layers that may provide paths for signal connection between the cap-type first device 110 and the second device 120. In yet another embodiment, a cap-type (not shown) first device 110 may include interconnect layers for signal connection between the second device 120 and yet another device (not shown) formed on top of the cap-type first device 110.

In an embodiment, the first and/or second devices 110, 120 may be MEMS-type devices. In an embodiment where the second device 120 may be a MEMS-type device, the electrical device portions 127 may provide for the formation of one or more MEMS electrical devices (not shown). For example, the electrical device portions 127 may be a vibrating mass, elastic strings or coils for performing functions in sensors, gyroscopes, accelerometers, RF devices or optical devices. MEMS electrical devices may be formed in other regions of the second device 120 as well. The second device 120 may also include active and/or passive devices (not shown) formed therein. Such active and passive devices may include transistors, capacitors, resistors, combinations of these and the like. The active and passive devices may be formed using any suitable methods.

In an embodiment, the first and/or the second substrates 112, 122 of the first and/or the second devices 110, 120 may comprise bulk silicon. In other embodiments, first and/or second substrates 112, 122 may comprise any semiconductor substrate, ceramic substrate, quartz substrate or the like. In some embodiments, the first and/or second devices 110, 120 may comprise a silicon-on-insulator ("SOI") or other like substrate. Other substrates that may be used include multi-layered substrates, gradient substrates, or hybrid orientation substrates.

In an embodiment, the first and/or second interconnect structures 116, 126 of the first and/or the second devices 110, 120 may comprise bulk silicon. In other embodiments, first and/or second interconnect structures 116, 126 may comprise any semiconductor material, ceramic, quartz or the like. In some embodiments, the first and/or second interconnect structures 116, 126 may comprise a silicon-on-insulator ("SOI") or the like. Other materials that may be used include multi-layered, gradient, or hybrid orientation materials.

In an embodiment, the electrical device portions 127 of the second device 120 may comprise bulk silicon. In other embodiments, electrical device portions 127 may comprise any semiconductor material, ceramic, quartz or the like. In some embodiments, the electrical device portions may comprise a silicon-on-insulator ("SOI") or the like. Other materials that may be used include multi-layered, gradient, or hybrid orientation materials.

In an embodiment, the first and/or the second dielectric layers 113, 123 of the first and/or second devices 110, 120 may be formed, independent of each other, of one or more dielectric materials such as oxide, nitride, silicon oxide, silicon nitride, low-k dielectrics such as carbon doped oxides, extremely low-k dielectrics such as porous carbon doped silicon dioxide, a polymer such as polyimide, or a combination thereof. During formation of the first and/or second devices 110, 120, the first and/or the second dielectric layers 113, 123 may be deposited through a process such as, for example, CVD, PVD such as sputtering or evaporation, plasma enhanced chemical vapor deposition ("PECVD"), atmospheric pressure CVD ("APCVD"), a spin-on-glass process, one or more subtractive etch processes, single Damascene techniques, and/or dual-Damascene techniques, the like or other acceptable methods.

The first and/or the second interconnect layers 114, 124 of the first and/or second devices 110, 120 may be formed, independent of each other, of copper, aluminum, gold or other like materials to provide conductive paths within the first and second devices 110, 120, respectively. The interconnect layers 114, 124 may be formed through a process such as, for example, CVD, PVD, electrochemical plating, one or more subtractive etch processes, single Damascene techniques, and/or dual-Damascene techniques, the like or other acceptable methods.

The first and/or second interconnect vias 115, 125 of the first and/or second devices 110, 120 may be formed, independent of each other, of copper, aluminum, tungsten, gold, combinations thereof, and/or the like. In various embodiments, the first and/or the second interconnect vias 115, 125 may be formed through an electrochemical deposition or plating process. In various embodiments, a plurality of first or second dielectric layers 113, 114, first or second interconnect layers 114, 124, respectively, and first or second interconnect vias 115, 125, respectively, may be used to form re-distribution layers ("RDLs") (not shown) within either the first or second devices 110, 120. The RDLs may be formed using an appropriate process, such as those discussed above.

Figure 2A:
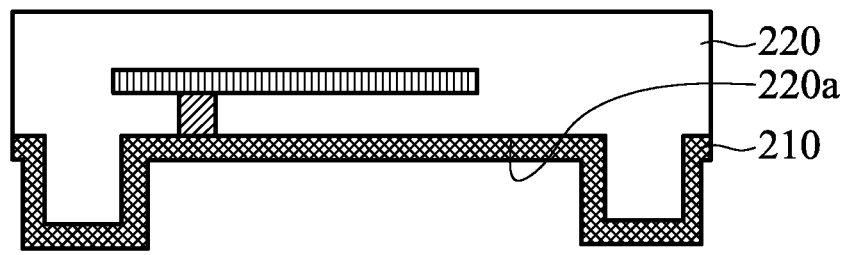
FIGS. 2a-2c illustrate bonding layers according to various embodiments.
Figure 2B:
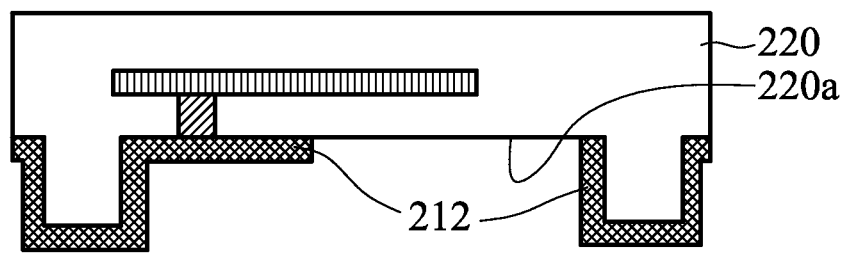
Figure 2C:
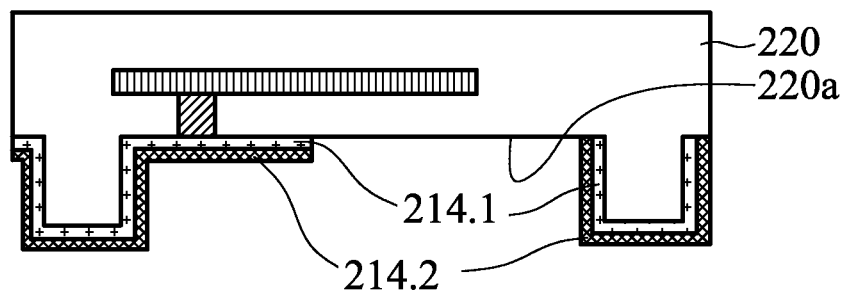

FIGS. 2a-2c illustrate cross sectional views of various bonding layers that may be formed according to various embodiments. Although FIGS. 2a-2c only illustrate a single device, the embodiments discussed herein are applicable to the first and/or second bonding layers 111, 121 for the first and/or the second devices 110, 120, as shown in FIG. 1.

As illustrated in FIG. 2a, a bonding layer 210 may be formed over a first surface 220a of a device 220. The bonding layer 210 may be formed using a process such as, for example, a blanket deposition process. As discussed above, the bonding layer 210 may be any of a eutectic alloy material, a low-melting point metal material, a getter material, combinations thereof or the like. As illustrated in FIG. 2b, a bonding layer 212 may be patterned to provide a localized bonding layer 212 formation about a first surface 220a of a device 220. Such a localized bonding layer 212 pattern may be used, for example, to provide an electrically conductive pathway to specific electrical devices (not shown) within the device 220. The bonding layer 212 may be any of a eutectic alloy material, a low-melting point metal material, a getter material, combinations thereof or the like.

FIG. 2c provides illustration for a bonding layer 214, which may include plurality of layers such as, for example, a first layer 214.1 and a second layer 214.2 that may be formed about a first surface 220a of a device 220. The first and second layers 214.1, 214.2 may be any of a combination of eutectic alloy materials, low-melting point materials, getter materials, combinations thereof or the like. In an embodiment, for example, the first layer 214.1 may be made of a eutectic alloy material and the second layer 214.2 may made of a getter material. Other layer combinations are within the scope of the present disclosure. In various embodiments, the first and/or second layers 214.1, 214.2 may be formed substantially about the entirety of the first surface 220a or may be patterned on the first surface 220a of the device 220.

Figure 3A:
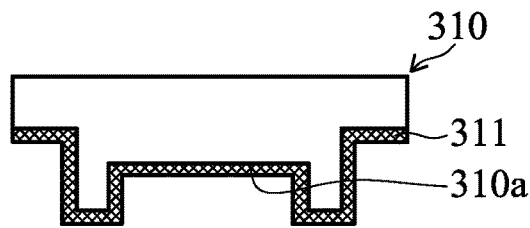
FIGS. 3a-3d illustrates various intermediate stages of forming a semiconductor structure according to an embodiment.
Figure 3B:
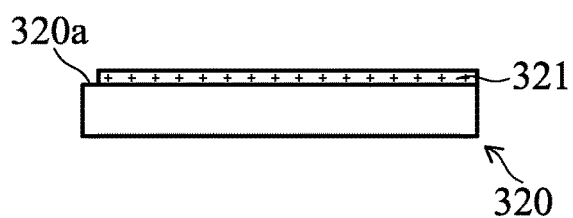
Figure 3C:
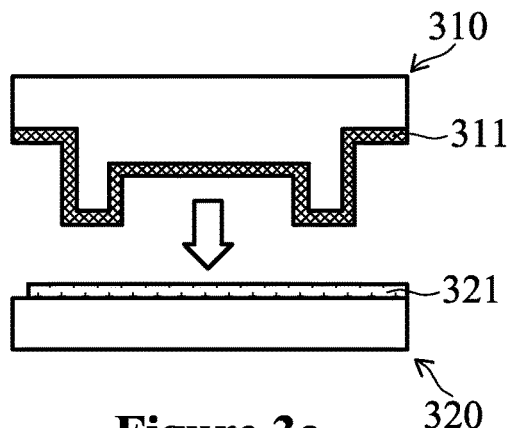

Referring to FIGS. 3a-3c, there are illustrated various intermediate stages for forming a semiconductor structure according to an embodiment. As illustrated in FIG. 3a, a first bonding layer 311 may be formed on a first surface 310a of a first device 310. As discussed above, the first device 310 may have electrical devices (not shown) formed therein. The first bonding layer 311 may provide an electrically conductive path to the electrical devices. In various embodiments, the first bonding layer 311 may be formed about substantially the entire first surface 310a or may be patterned (as discussed above in FIGS. 2b-2c) about the first surface 310a of the first device 310.

As illustrated in FIG. 3b, a second bonding layer 321 may be formed on first surface 320a of a second device 320. The second device 320 may also have electrical devices (not shown) formed therein. The second bonding layer 321 may provide an electrically conductive path to the electrical devices. In various embodiments, the second bonding layer 321 may be formed about substantially the entire first surface 320a or may be patterned (as discussed above in FIGS. 2b-2c) about the first surface 320a of the second device 320.

In various embodiments, the electrical devices (not shown) of the first or second devices 310, 320 may include active or passive devices, CMOS devices, and/or MEMS devices. In various embodiments, the first and/or the second bonding layers 311, 321 may be formed of a eutectic alloy material, a low melting point metal material, a getter material or combinations thereof. The first and/or the second bonding layers 311, 321 may be formed by CVD, PVD such as sputtering or evaporation, electron gun, ion beam, energy beam, plating, one or more subtractive etch processes, single Damascene techniques, and/or dual-Damascene techniques, the like or other acceptable methods. In an embodiment, the first and/or the second bonding layers 311, 321 may be formed as a plurality of layers including the materials, as discussed previously.

As shown in FIG. 3c, the first and second bonding layers 311, 321 of the respective first and second devices 310, 320 may be contacted. In an embodiment, a heat may be applied to a first temperature. For example, the first temperature may be in a range from approximately 100-500° C.

In other embodiments, the first temperature may vary depending on selected bonding processes or devices to be bonded. In an embodiment, a pressure may be applied to the first and/or the second devices 310, 320 to promote bonding between the first and second bonding layers 311, 321. In an embodiment, for example, the pressure may be in a range from approximately 10-100 KN. In other embodiments, the pressure may vary depending on selected bonding process or devices to be bonded. In another embodiment, following formation of the semiconductor structure 340 a post-anneal process may be performed wherein the semiconductor structure 340 may be heated to a second temperature.

Figure 3D:
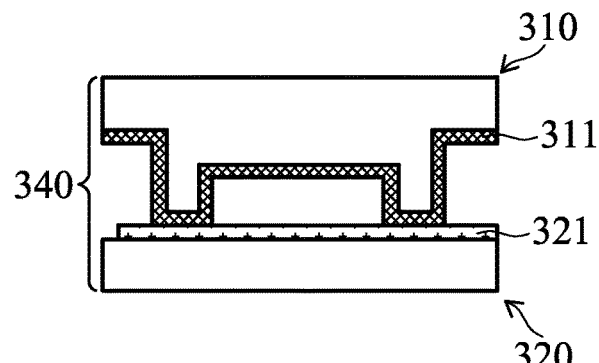

As shown in FIG. 3d, a semiconductor structure 340 may be formed by bonding the first and second devices 310, 320, wherein electrical contact between the devices 310, 320 may be provided by the respective first and second bonding layers 311, 321. The strength of the bond for the semiconductor structure 340 may be sufficient to maintain a good hermetic seal between the bonded first and second devices 310, 320 throughout subsequent back-end manufacturing processes, which may be performed following the bonding. Such manufacturing processes may include, but not be limited to, wafer thinning that may be performed by chemical-mechanical polishing ("CMP") or grinding, formation of subsequent electrical devices on or within the wafers via one or more etch back, Damascene and/or dual-Damascene processes, encapsulation of the semiconductor structure 340, and the like.

Figure 4:
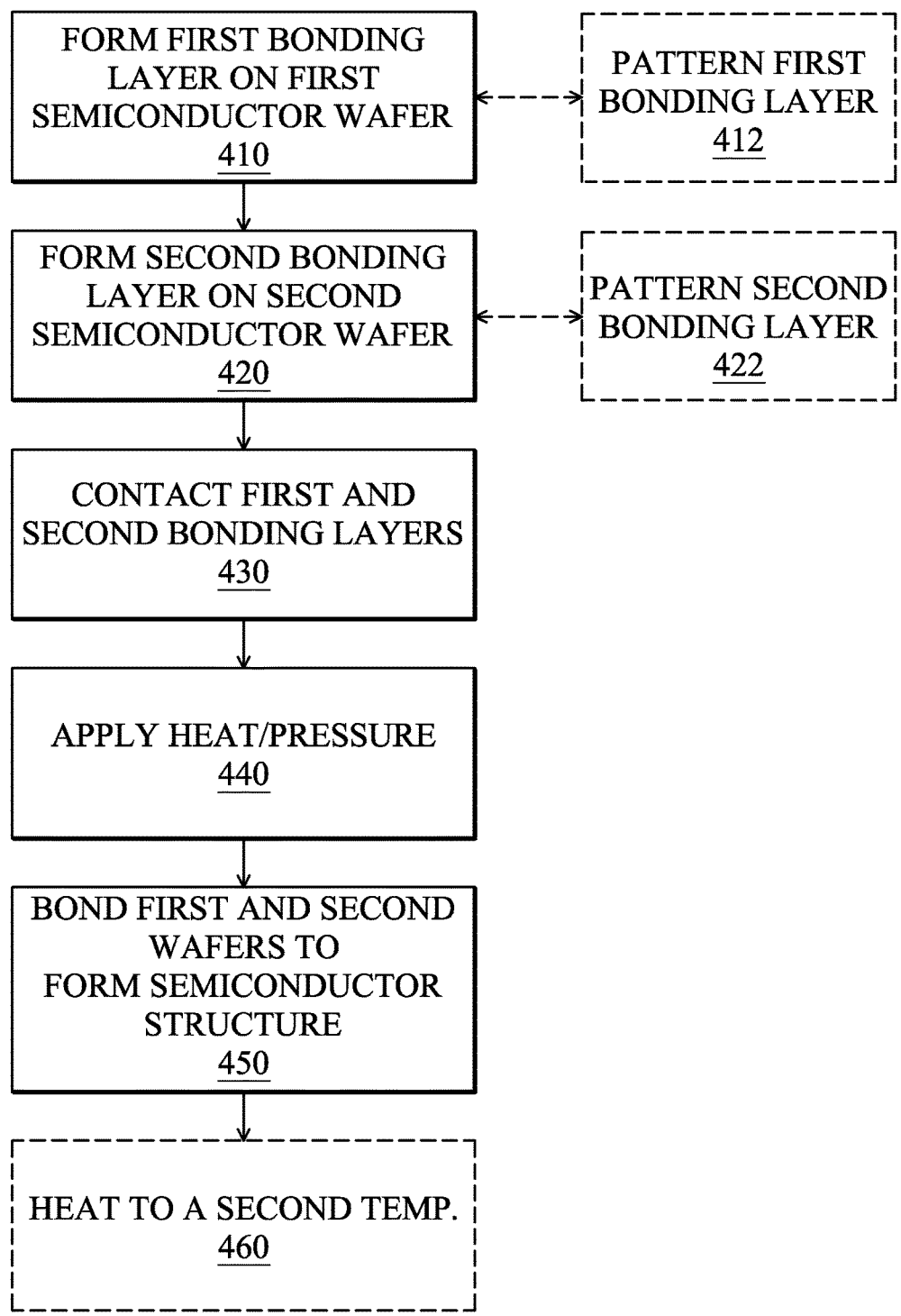
FIG. 4 illustrates a flow diagram for a method of forming a semiconductor structure according to an embodiment.

Referring to FIG. 4, there is shown a flow diagram that may illustrate a method 400 for forming a semiconductor structure according to an embodiment. As illustrated in block 410, the method 400 may form a first bonding layer on a first surface of a first device. The method 400 may form a second bonding layer on a first surface of a second device (block 420). The method 400 may contact the first bonding layer of the first device and the second bonding layer of the second device to each other (block 430). The method 400 may heat the contacted first and second bonding layers to a first temperature (block 440). Optionally, the method 400 may heat and apply a pressure to the first and/or second devices (also block 440). The pressure may promote bonding and good hermetic sealing between the first and second devices. The method 400 may bond the first and second devices to each other for form the semiconductor structure (block 450).

In an embodiment, the method 400 may pattern the first bonding layer on the first surface of the first device (block 412). In another embodiment, the method 400 may pattern the second bonding layer on the first surface of the second device (block 422). In an embodiment, the method may heat the semiconductor structure to a second temperature (block 460). The second heat may, for example, provide annealing for the semiconductor structure.

In an embodiment, an apparatus is provided. The apparatus may comprise a first device having a surface with a first bonding layer formed thereon, the first bonding layer providing electrical connection to the first device; a second device having a surface with second bonding layer formed thereon, the second bonding layer providing electrical connection to the second device; a micro chamber between the first and second device; and wherein the first bonding layer and the second bonding layer are bonded together and at least one of the first bonding layer or the second bonding layer comprise a getter material exposed to the micro chamber.

In another embodiment, another apparatus is provided. The apparatus may comprise a device having an interconnect structure, a cavity, and at least one electrical device formed therein; and a bonding layer covering the interconnect structure of the device, wherein the bonding layer includes a conductive getter material having a portion coupled to the at least one electrical device and having a portion exposed to the cavity.

In an embodiment, a method of forming a semiconductor structure is provided. The method may comprise forming a first bonding layer on a first surface of a first device; forming a second bonding layer on a first surface of a second device, the second device including one or more micro chambers; and bonding the first bonding layer to the second bonding layer to form an electrical connection between the first device and the second device, wherein at least one of the first bonding layer or the second bonding layer comprises a getter material exposed to the one or more micro chambers.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising: a first device having active devices in a first substrate, a first bonding layer extending along the first substrate, the first bonding layer having a first bonding surface and providing electrical connection to the active devices;
a second device having a MEMS-type electrical device over a second substrate, a second bonding layer extending along the second substrate, the second bonding layer having a second bonding surface and providing electrical connection to the MEMS-type electrical device;
a structural feature extending from the first substrate towards the second substrate, the structural feature being a semiconductor material, the first bonding layer extending along and physically contacting a sidewall of the structural feature, the first bonding layer electrically connect connecting the active devices of the first device and the MEMS-type electrical device of the second device; and
wherein the first bonding layer and the second bonding layer are bonded together, a micro chamber being formed between the first device and the second device, and at least one of the first bonding layer or the second bonding layer comprises a getter material extending throughout its volume and exposed to the micro chamber, wherein a portion of the getter material extends continuously as an unbroken region from outside the micro chamber to within the micro chamber including along at least one of the first bonding surface or the second bonding surface, and within the micro chamber; and wherein the first bonding layer comprises a first layer comprising the getter material and a second layer comprising a eutectic metal material.

2. The apparatus of claim 1, wherein the second bonding layer comprises a first layer comprising the getter material and a second layer comprising a eutectic metal material.

3. The apparatus of claim 1, wherein the getter material comprises a material selected from a group consisting of zirconium, barium, titanium, an aluminum-based alloy and combinations thereof.

4. The apparatus of claim 1, wherein the first bonding layer or the second bonding layer comprise a eutectic alloy material.

5. The apparatus of claim 1, wherein the first bonding layer or the second bonding layer comprise a material selected from a group consisting of indium, gold, tin, copper and combinations thereof.

6. The apparatus of claim 1, wherein at least one of the first device or the second device has electrical devices formed therein.

7. The apparatus of claim 1, wherein the MEMS-type electrical device is exposed to the micro chamber.

8. The apparatus of claim 1, wherein the first bonding layer comprises a first portion extending along the first substrate of the first device and a second portion extending along the first substrate of the first device, wherein the first portion and the second portion are separated by an opening.

9. An apparatus comprising:
a device having a substrate, active devices in the substrate, a structural feature extending from the substrate, a MEMS-type device in the cavity, the structural feature being a semiconductor material; and
a bonding layer including a conductive getter material extending continuously as a single unbroken region from a first surface of the cavity, along and physically contacting a first sidewall surface of the structural feature inside the cavity, and along and physically contacting a second sidewall surface of the structural feature outside the cavity, wherein the bonding layer electrically connects the active devices to the MEMS-type device.

10. The apparatus of claim 9, wherein the conductive getter material comprises a material selected from a group consisting of zirconium, barium, titanium, an aluminum-based alloy and combinations thereof.

11. The apparatus of claim 9, wherein the bonding layer is formed to a thickness of approximately 200 nm to approximately 5000 nm.

12. A device comprising:
a first structural feature adhered to a substrate, the substrate comprising active devices, the first structural feature having a connecting portion extending away from the substrate, the first structural feature being a semiconductor material;
a second structural feature adhered to a MEMS electrical device;
a first bonding layer bonding the first structural feature to the second structural feature, a micro chamber being formed between the first structural feature and the second structural feature, the MEMS electrical device exposed to the micro chamber, the first bonding layer comprising an eutectic metal material and a getter material extending continuously as an unbroken region from outside the micro chamber to within the micro chamber, the first bonding layer physically contacting a first sidewall surface of the first structural feature inside the micro chamber, the first bonding layer physically contacting a second sidewall surface of the first structural feature outside the micro chamber; and
a via extending through the first structural feature, the via and the first bonding layer forming an electrically conductive pathway connecting the active devices to the MEMS electrical device.

13. The device of claim 12, wherein the first bonding layer comprises:
a first layer of the getter material; and
a second layer of the eutectic metal material.

14. The device of claim 12, wherein the first structural feature is adhered to the substrate by a first dielectric layer, the via extending through the first dielectric layer.

15. The device of claim 12, wherein the first bonding layer extends along a top surface of the first structural feature.

16. The device of claim 15, further comprising:
a second bonding layer extending along a top surface of the second structure feature, the second bonding layer bonded to the first bonding layer, the second bonding layer comprising the eutectic metal material and the getter material, the second bonding layer extending continuously as an unbroken region from outside the micro chamber to within the micro chamber.

17. The device of claim 15, wherein the first bonding layer includes openings defining multiple electrically conductive regions.

18. The device of claim 12, wherein the getter material is one of zirconium, barium, titanium, an aluminum-based alloy, or combinations thereof.

19. The device of claim 12, wherein the eutectic metal material is one of indium, gold, tin, copper, or combinations thereof.

20. The device of claim 12, wherein the first and second structure features are not electrically conductive.

* * * * *